United States Patent
Wu et al.

(10) Patent No.: US 7,611,589 B2
(45) Date of Patent: Nov. 3, 2009

(54) METHODS OF SPIN-ON WAFER CLEANING

(75) Inventors: Jun Wu, Gueishan Township, Taoyuan County (TW); Dong-Xuan Lu, Miaoli Hsien (TW); Shih-Chi Lin, Taipei (TW); Wen-Long Lee, Taipei (TW); Yi-An Jian, Banchiau (TW); Guang-Cheng Wang, Taipei (TW); Shiu-Ko JangJian, Fenshan (TW); Chyi-Tsong Ni, Taipei (TW); Szu-An Wu, Hsinchu (TW); Ying-Lang Wang, Longjing Township, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 652 days.

(21) Appl. No.: 11/072,114

(22) Filed: Mar. 4, 2005

(65) Prior Publication Data
US 2006/0196526 A1   Sep. 7, 2006

(51) Int. Cl.
*B08B 3/02* (2006.01)
*B08B 1/04* (2006.01)

(52) U.S. Cl. .............................. 134/33; 134/32; 134/34

(58) Field of Classification Search ................... 134/32, 134/33, 34
See application file for complete search history.

(56) References Cited

U.S. PATENT DOCUMENTS

| 4,027,686 | A | * | 6/1977 | Shortes et al. | ................. 134/33 |
| 5,364,474 | A | * | 11/1994 | Williford, Jr. | ................. 134/32 |
| 5,551,986 | A | * | 9/1996 | Jain | ............................... 134/6 |
| 6,260,562 | B1 | * | 7/2001 | Morinishi et al. | .......... 134/57 R |
| 6,290,865 | B1 | * | 9/2001 | Lloyd et al. | .................... 216/92 |
| 2002/0170572 | A1 | * | 11/2002 | Tomita et al. | ................. 134/1.3 |
| 2004/0250839 | A1 | * | 12/2004 | Robertson et al. | ............. 134/33 |
| 2006/0042664 | A1 | * | 3/2006 | Hardikar et al. | ................ 134/31 |

* cited by examiner

*Primary Examiner*—Michael Barr
*Assistant Examiner*—Saeed T Chaudhry
(74) *Attorney, Agent, or Firm*—Thomas, Kayden, Horstemeyer & Risley

(57) ABSTRACT

A method for spin-on wafer cleaning. The method comprises controlling spin speed and vertical water jet pressure. The vertical jet pressure and the spin speed are substantially maintained in inverse proportion. Wafer spin speed is between 50 to 1200 rpm. Vertical wafer jet pressure is between 0.05 to 100 KPa.

14 Claims, 3 Drawing Sheets

METHODS OF SPIN-ON WAFER CLEANING

BACKGROUND

The present invention relates in general to wafer cleaning, and more particularly to methods of spin-on wafer cleaning.

Semiconductor process technologies, such as deposition, etching and polishing, usually generate particles. If the particles are not removed, they can seriously impact product yield. For example, the particles may impede current flow and degrade performance of the product, or cause surface roughness affecting subsequent processing. Also, particles dropping from a wafer and into equipment can cause damage to and shorten the lifespan of the equipment.

In a scrubber, a wafer to be cleaned is fixed on a vacuum chuck. De-ionized water is sprayed on the spinning wafer surface to remove particles, referred to as spin-on wafer cleaning.

Wafer spin in a conventional spin-on wafer cleaning process creates electrostatic charge generation friction between the wafer and de-ionized water or air. Since de-ionized water is not conductive, the accumulated electrostatic charge generates a voltage on the wafer surface. The electrostatic charge on the wafer may cause a shift in the electrical characteristics of a semiconductor device and induce low yield.

In one method commonly used in spin-on wafer cleaning to reduce voltage build up on the semiconductor wafer, chemicals, such as carbon dioxide, are added to the de-ionized water to increase conductivity, thereby dispersing the generated charge. However, it can be inconvenient to prepare such cleaning liquid and chemicals remaining on the wafer surface after cleaning may affect the electrical characteristics of the semiconductor device.

SUMMARY

An embodiment of a method for spin-on wafer cleaning with pure de-ionized water comprises controlling spin speed and vertical water jet pressure. Vertical jet pressure on the wafer and wafer spin speed are maintained in inverse proportion. Spin speed ranges from 0 to 1200 rpm. Vertical wafer jet pressure ranges from 0 to 120 KPa. The method suppresses charge accumulation and removes particles during spin-on wafer cleaning.

DESCRIPTION

Figure 1:
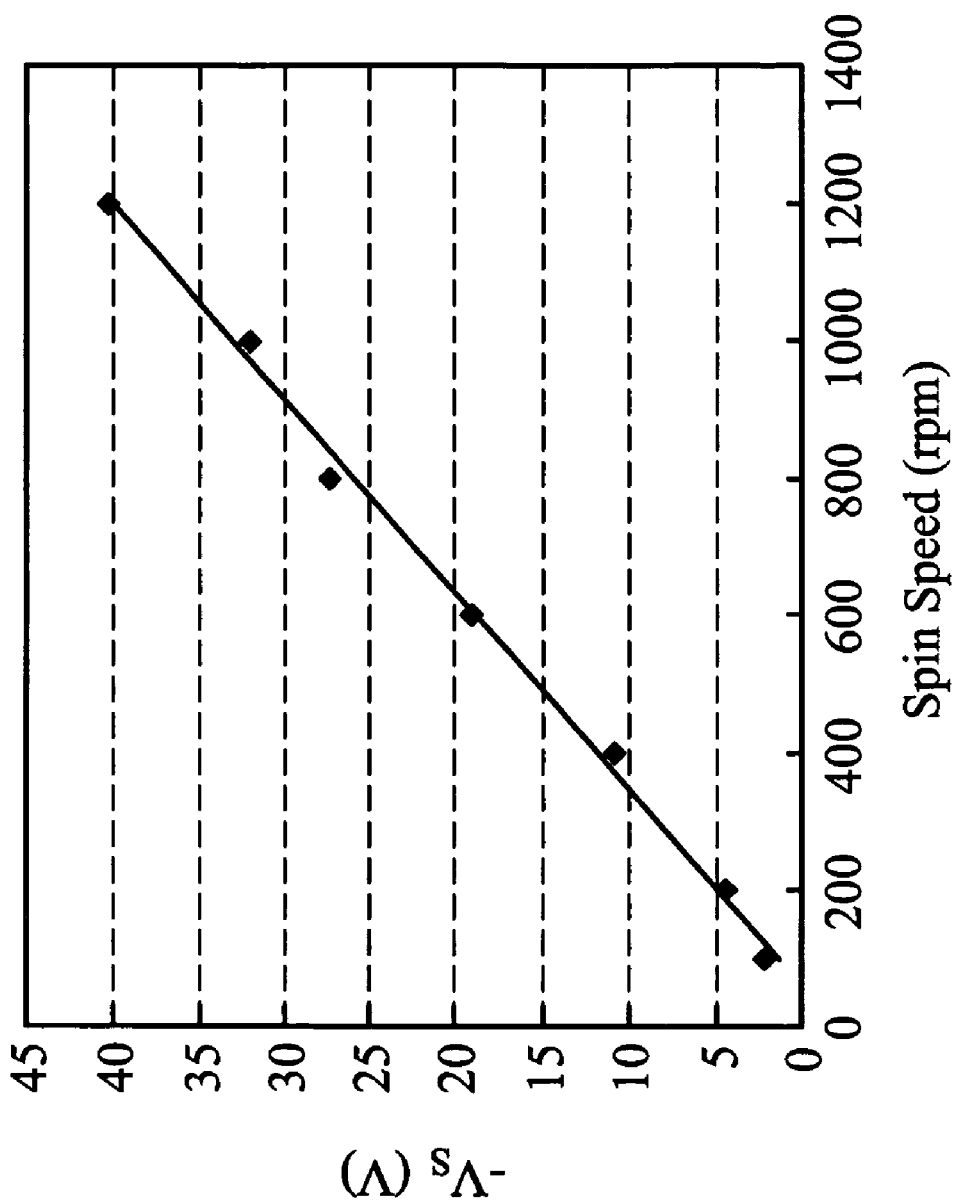
FIG. 1 shows a voltage buildup on a semiconductor wafer corresponding to spin speed as the wafer is sprayed with a chemical solution.

FIG. 1 is a diagram of a voltage built up on a semiconductor wafer, sprayed with a solution of chemicals, versus the spin speed thereof, with the x-axis representing spin speed in rpm, of the semiconductor wafer. The y-axis represents voltage buildup on the semiconductor wafer due to electrostatic charge accumulation. Note that charge buildup typically increases with spin speed.

In an embodiment of the invention, spin speed and vertical water jet pressure are controlled during spin-on wafer cleaning in which particles on the semiconductor wafer are removed.

Figure 2:
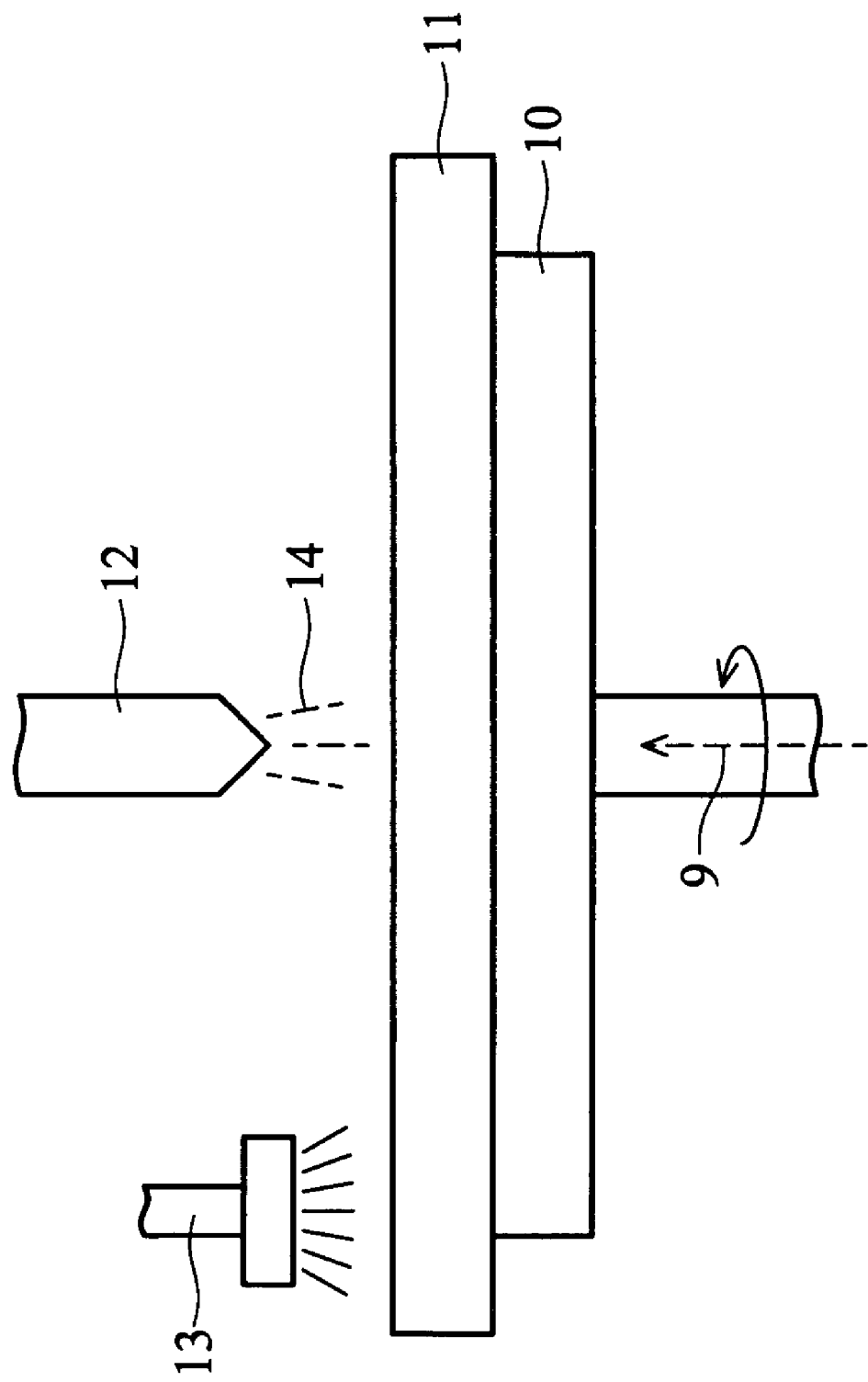
FIG. 2 is a schematic diagram of an embodiment of spin-on wafer cleaning with pure de-ionized water.

FIG. 2 illustrates a schematic diagram according to an embodiment of a method for spin-on wafer cleaning with pure de-ionized water 14. Wafer 11 is fixed on a vacuum chuck 10. The wafer is preferably a semiconductor substrate, but is not limited thereto. The surface temperature of the wafer 11 is also adjusted via the vacuum chuck 10 to, typically, 10° C. to 90° C. A cleaning liquid 14 is sprayed on the spinning wafer surface through a nozzle 12. The nozzle 12 is positioned 5 to 300 millimeters from the wafer surface, substantially on an axis 9. The cleaning liquid 14 can be a liquid substantially free of chemicals such as carbon dioxide, and can also be pure or substantially de-ionized water. The chuck 10 spins about the axis 9 to spread the cleaning liquid 14 over the wafer 11.

Figure 3:
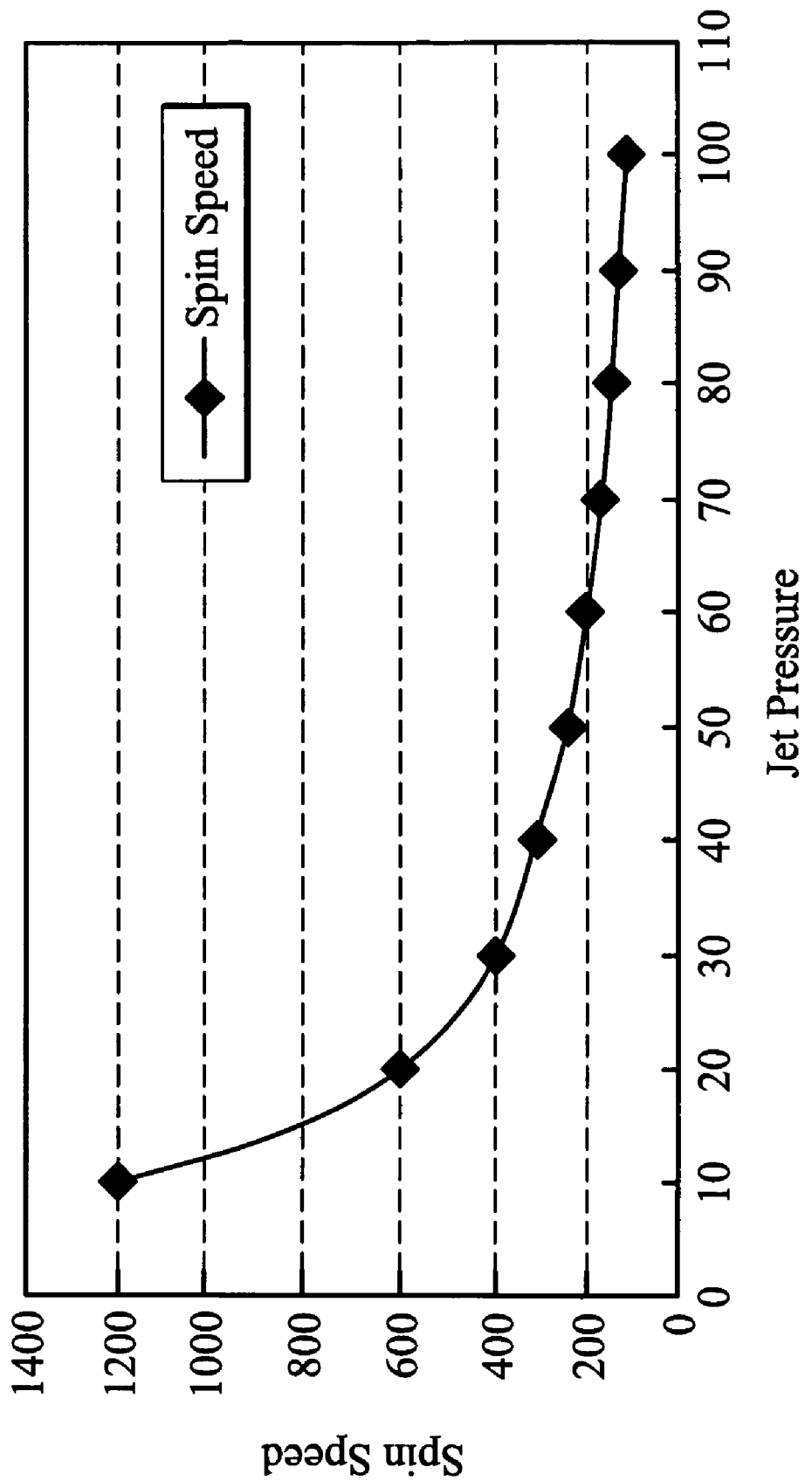
FIG. 3 shows correlative spin speed and vertical water jet pressure parameters providing optimum charge reduction according to an embodiment of the invention.

An embodiment of the invention comprises controlling spin speed between 0 to 1200 rpm and vertical wafer jet pressure between 0 to 120 KPa, with preferable jet pressure from 0 to 120 Kpa and wafer spin speed from 0 to 1200 rpm. Referred correlation of parameters spin speed and vertical wafer jet pressure are shown in FIG. 3. Maintenance of vertical jet pressure and spin speed in inverse proportion provides a removal efficiency of particles from the semiconductor wafer no less than 95%. The parameters follow:

$$\text{Jet pressure(Kpa)} \cdot \text{spin speed(rpm)} < 12000 \text{ Kpa} \cdot \text{rpm}$$

Additionally, a brush 13, as shown in FIG. 2, can further enhance removal of particles from the wafer surface, especially the underside, to avoid cross-contamination between wafers. The brush 13 spins around its own axis and it may move along a radius of the wafer 11. Typically, the spin speed of the brush 13 is between 50 and 2500 rpm.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A spin clean method, comprising:
   providing a pressurized cleaning liquid onto a wafer while spinning the wafer;
   maintaining the product of the substantially vertical jet pressure on the wafer and wafer spin speed in a constant; and
   changing substantially vertical jet pressure on the wafer and wafer spin speed in inverse proportion relationship.

2. The method as claimed in claim 1, wherein the substantially vertical jet pressure is from about 100 KPa to about 0.05 KPa, and wafer spin speed is from about 50 to about 1200 rpm.

3. The method as claimed in claim 1, wherein the cleaning liquid consists essentially of de-ionized water.

4. The method as claimed in claim 1, further comprising scrubbing the wafer with at least one brush and the spin speed of the at least one brush is from about 50 to about 2500 rpm.

5. A spin clean method for removing particles from a wafer, the method comprising:
   positioning a wafer onto a chuck, the wafer having a plurality of particles thereon;
   providing a pressurized cleaning liquid onto the wafer from a nozzle positioned above the wafer;
   spinning the chuck about an axis to remove the particles;

maintaining the product of the substantially vertical jet pressure on the wafer and wafer spin speed in a constant; and changing substantially vertical jet pressure on the wafer and wafer spin speed in inverse proportion relationship.

6. The method as claimed in claim 5, wherein the substantially vertical jet pressure is from about 0.05 KPa to about 100 KPa, and wafer spin speed is from about 50 to about 1200 rpm.

7. The method as claimed in claim 5, wherein the cleaning liquid consists essentially of de-ionized water.

8. The method as claimed in claim 5, further comprising scrubbing the wafer with at least one brush and the spin speed of the at least one brush is from about 50 to about 2500 rpm.

9. The method as claimed in claim 5, wherein the nozzle is positioned from about 5 to about 30 millimeters from the wafer surface.

10. A spin clean method for removing particles from a wafer, the method comprising:

positioning a wafer onto a chuck, the wafer having a plurality of particles thereon;

providing pressurized cleaning liquid onto the wafer from a nozzle positioned above the wafer;

spinning the chuck about an axis to remove the particles; and changing vertical jet pressure on the wafer and wafer spin speed in inverse proportional relationship; and maintaining the product of the substantially vertical jet pressure on the wafer and wafer spin speed in a constant according to the equation:

$$\text{Jet pressure (KPa)} * \text{spin speed (rpm)} \leqq 12000 \text{ KPa*rpm}.$$

11. The method as claimed in claim 10, wherein the vertical jet pressure is from about 100 KPa to about 0.05 KPa, and wafer spin speed is from about 50 to about 1200 rpm.

12. The method as claimed in claim 10, wherein the cleaning liquid consists essentially of de-ionized water.

13. The method as claimed in claim 10, further comprising scrubbing the wafer with at least one brush and the spin speed of the at least one brush is from about 50 to about 2500 rpm.

14. The method as claimed in claim 10, wherein the nozzle is positioned from about 5 to about 30 millimeters from the wafer surface.

* * * * *